(12) United States Patent
Jager et al.

(10) Patent No.: US 8,456,063 B2
(45) Date of Patent: Jun. 4, 2013

(54) DEVICE FOR CONVERTING MECHANICAL IMPACT ENERGY INTO ELECTRICAL ENERGY WITH OPTIMISED EFFICIENCY

(75) Inventors: Thomas Jager, Grenoble (FR); Jean-Jacques Chaillout, Saint Etienne de Crossey (FR); Ghislain Despesse, Saint Egreve (FR); Romain Guigon, Marseille (FR)

(73) Assignee: Commissariat a l'Energie Atomique, Paris (FR)

( * ) Notice: Subject to any disclaimer, the term of this patent is extended or adjusted under 35 U.S.C. 154(b) by 236 days.

(21) Appl. No.: 12/526,246

(22) PCT Filed: Feb. 7, 2008

(86) PCT No.: PCT/EP2008/051512
§ 371 (c)(1),
(2), (4) Date: Nov. 17, 2009

(87) PCT Pub. No.: WO2008/101814
PCT Pub. Date: Aug. 28, 2008

(65) Prior Publication Data
US 2010/0072859 A1    Mar. 25, 2010

(30) Foreign Application Priority Data
Feb. 8, 2007 (FR) .................................. 07 53151

(51) Int. Cl.
*H01L 41/113* (2006.01)
(52) U.S. Cl.
USPC .......................................... 310/339

(58) Field of Classification Search
USPC ........................................... 310/339
See application file for complete search history.

(56) References Cited

U.S. PATENT DOCUMENTS

| | | | |
|---|---|---|---|
| 4,404,490 A | 9/1983 | Taylor et al. | |
| 4,509,527 A | 4/1985 | Fraden | |

(Continued)

FOREIGN PATENT DOCUMENTS

| | | | |
|---|---|---|---|
| CN | 101575082 | * 11/2009 | |
| DE | 39 35 807 | 5/1991 | |

(Continued)

OTHER PUBLICATIONS

Kang, Ji-Yoon et al., "Optimal Design of Piezoelectric Cantilever for a Micro Power Generator With Microbubble", 2nd Annual International IEEE-EMBS Special Topic Conference on Microtechnologies in Medicine & Biology, May 2-4, 2002, pp. 424-427.

(Continued)

*Primary Examiner* — Thomas Dougherty
(74) *Attorney, Agent, or Firm* — Nixon Peabody LLP

(57) ABSTRACT

Device for converting mechanical energy from the impact of objects into electrical energy, comprising a frame, a membrane suspended on said frame by at least a first and second longitudinal end, said membrane being intended to be impacted by said objects in a direction substantially transverse to a mid-plane of the membrane, said membrane comprising a core made from material for transducing mechanical energy into electrical energy, extending from the first longitudinal end to the second longitudinal end, and at least one electrode on a first face of the core and at least one electrode on a second face of the core, said electrodes extending from the first to the second longitudinal end.

15 Claims, 4 Drawing Sheets

U.S. PATENT DOCUMENTS

| | | | |
|---|---|---|---|
| 4,524,294 A | 6/1985 | Brody | |
| 6,407,484 B1 * | 6/2002 | Oliver et al. | 310/339 |
| 6,876,135 B2 * | 4/2005 | Pelrine et al. | 310/339 |
| 7,479,727 B1 * | 1/2009 | Grace | 310/339 |
| 2001/0032663 A1 | 10/2001 | Pelrine et al. | |
| 2002/0043895 A1 | 4/2002 | Richards et al. | |
| 2004/0041498 A1 * | 3/2004 | Sakai | 310/339 |

FOREIGN PATENT DOCUMENTS

| | | |
|---|---|---|
| DE | 198 31 692 | 1/2000 |
| EP | 1 394 868 | 3/2004 |
| GB | 0003556.8 * | 2/2000 |
| JP | 2001-339963 * | 12/2001 |
| WO | 00/13582 | 3/2000 |
| WO | 00/74224 | 12/2000 |

OTHER PUBLICATIONS

International Search Report for International Application No. PCT/EP2008/051512, mailed Apr. 2, 2008.

* cited by examiner

DEVICE FOR CONVERTING MECHANICAL IMPACT ENERGY INTO ELECTRICAL ENERGY WITH OPTIMISED EFFICIENCY

CROSS REFERENCE TO RELATED APPLICATIONS OR PRIORITY CLAIM

This application is a national phase of International Application No. PCT/EP2008/051512, entitled "DEVICE FOR CONVERTING THE MECHANICAL ENERGY OF IMPACTS INTO ELECTRIC ENERGY WITH AN OPTIMISED YIELD", which was filed on Feb. 7, 2008, and which claims priority of French Patent Application No. 07 53151, filed Feb. 8, 2007.

TECHNICAL FIELD AND PRIOR ART

The present invention relates to a device for recovering mechanical energy as electrical energy, in particular to a device able to convert the energy released by impacts of objects impacting on a deformable surface. The objects the energy of which it is wished to recover may for example be raindrops, the device then being disposed in an external environment, or rigid objects, of the powder, grain etc. type in a loading device for example.

Energy recovery devices are known in the form of a ribbon comprising an element made from piezoelectric material disposed in a flow of liquid, for example water, the flow flowing substantially parallel to the surface of the element made form piezoelectric material. Deformation of the element generates the appearance of a voltage at the terminals of electrodes on each side of the piezoelectric material.

However, this device does not afford optimum recovery of the energy resulting from impacts of objects. This is because the device of the prior art functions by continuous action of the fluid uniformly over its entire surface. However, in the case of impacts of objects, the location of the impacts is random and discrete.

Moreover, this device is not adapted to be deformed optimally for impacts transverse to the surface of the element made from piezoelectric material.

There is also known from the document "Optimal design of piezoelectric cantilever for a micro power generator with microbubble" 2$^{nd}$ Annual International IEEE-EMBS Special Topic Conference on Microtechnologies in Medicine & Biology, May 2-4, 2002, Madison, Wis. USA, Poster 102; page 424-427, a piezoelectric conversion structure deformed by the periodic abutment of bubbles on a deformable structure, this structure comprises a beam made from piezoelectric material embedded at a first end and comprising at a second end a plate intended to receive impacts. This structure is effective only if the impacting object deforms the structure at a precise point. If the bubbles impact the beam directly, the quantity of charges produced is very low.

Moreover, the energy recovery zones formed by the beam itself and the impact zone are physically separate. Thus, having regard to the total surface area of the system, the effective zone is relatively small.

Consequently one aim of the present invention is to offer a device for recovering energy resulting from the impact of objects on a membrane, wherein the recovery of energy is not very dependent on the place of impact of the objects on the membrane.

DISCLOSURE OF THE INVENTION

The aim stated above is achieved by a device comprising an element made from material able to generate an electrical voltage under the application of a mechanical force, suspended along its largest dimension and directly receiving the impacts of the objects, the mechanical energy of which it is wished to convert, the element comprises on each side of its surface electrodes extending along its largest dimension.

In other words, the device is such that the transducing material is acted on directly and the electrodes are distributed over the entire length of the material. This reduces the influence of the geographical location of the impacts on the membrane. Thus good efficiency of conversion over the entire surface of the material is achieved, and the quantity of energy recovered is then substantially the same whatever the point of impact on the membrane.

By virtue of the present invention, the spatial efficiency of the recovery is increased and the sensitivity of the energy recovery to the zone acted on mechanically by the impact of an object or the action of a fluid is very substantially reduced.

The conversion structures proposed therefore make it possible to recover energy from objects uniformly impacting the entire surface of the system. There is then no longer any physical separation between the impact zone and the conversion and energy recovery zone formed by the material transducing mechanical energy into electrical energy and the associated electrodes. By virtue of the present invention, we can increase the efficacy of recovery of energy for stresses with random spatial distribution as may be for example the impact of raindrops, drops coming from sprinkling systems, or the impact of solid particles during sieving or transfers for any storage or use.

It is possible to make provision for producing membranes in which the transducing material is entirely or partially covered by the electrodes. In the latter case, the electrodes are then no longer entirely continuous in width (that is to say with the same geometry as the membrane) but divided in order to form ribbons with a width of the same order of magnitude as that of the objects at the time of impact, which optimises the energy recovery: in this way the variation in deformation and mean force under the electrodes is maximised by preventing electrical dissipations in the areas that are not mechanically stressed.

It is also possible to provide a perforated membrane to facilitate the discharge of the objects that impacted the membrane. In this embodiment, the membrane can be formed by discrete strips, juxtaposed in parallel.

The energy recovery device can also serve to supply an associated or integrated sensor, i.e. the sensor being formed by the membrane itself.

The subject matter of the present invention is therefore principally a device for converting mechanical energy from impacts of objects into electrical energy, comprising a frame, a membrane suspended on said frame by at least a first and second longitudinal end, said membrane being intended to be impacted by said objects in a direction substantially transverse to a mid-plane of the membrane, said membrane comprising a core made from material for transducing mechanical energy into electrical energy extending from the first longitudinal end to the second longitudinal end, and at least one electrode on a first face of the core and at least one electrode on a second face of the core, the said electrodes extending from the first to the second longitudinal end, and at least partially overlapping.

In a first embodiment, the device according to the invention can comprise a continuous electrode on the first face of the core and a continuous electrode on the second face of the core.

The membrane can advantageously comprise apertures to allow the flow of the objects.

In a second embodiment, the device according to the invention comprises a plurality of electrodes on the first face of the core and a plurality of electrodes on the second face of the core, each plurality of electrodes comprising discrete juxtaposed blades extending from the first longitudinal end of the membrane to the second longitudinal end of the membrane, the plurality of electrodes on the first face and the plurality of electrodes on the second face at least partially overlapping. The quantity of energy thus recovered is further increased.

In a third embodiment, the core can comprise apertures extending between the electrode blades.

These apertures can extend longitudinally from the first to the second longitudinal end of the core so as to define a membrane in the form of juxtaposed suspended strips. The membrane, or more particularly the strips, being of small width, the latter are more easily deformable for the same impact, which makes it possible to increase the quantity of energy converted. The width of the blades is for example substantially equal to that of the strips.

The width of the electrodes in blade form is advantageously greater than the size of the objects intended to impact the membrane.

Provision can be made for the membrane not to be subjected, in the absence of impact, to any mechanical tension, in the case of random impacts, and thus it undergoes a high variation in deformation.

Provision can be made for the membrane to be subjected to a given mechanical tension in the absence of impact so that the resonant frequency of the membrane coincides with the frequency of the impacts, in the case of repetitive impacts at regular frequency, which further increases the quantity of mechanical energy converted into electrical energy.

The transducing material of the core can for example be a piezoelectric material or an electroactive material.

The device according to the present invention can also comprise a device for converting solar energy into electrical energy, comprising photovoltaic cells, the membrane being produced from a material transparent to light, the photovoltaic cells being disposed downstream of the membrane with respect to the direction of movement of the objects.

Another subject matter of the present invention is a system comprising a conversion device according to the present invention, and a sensor for a physical quantity, said sensor being at least partially powered by the conversion device.

In this system, the membrane can form the sensitive area of the sensor, making it possible to obtain information on the objects impacting said membrane.

BRIEF DESCRIPTION OF DRAWINGS

The present invention will be better understood by means of the following description and the accompanying drawings, in which.

DETAILED DISCLOSURE OF PARTICULAR EMBODIMENTS

Figure 1:
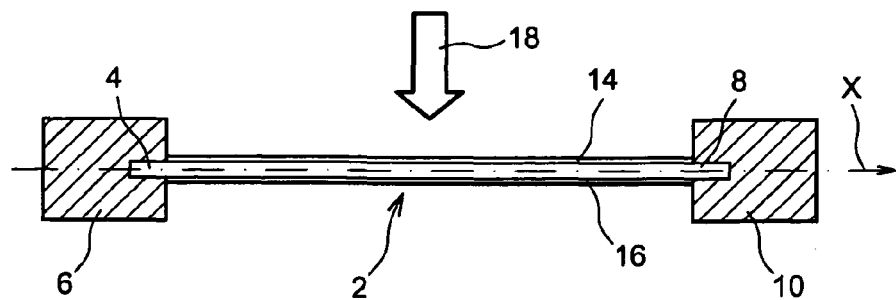
FIG. 1 is a schematic representation in longitudinal section of first embodiment of an energy recovery device according to the present invention.

In FIG. 1, a detail of the embodiment of an energy recovery device according to the present invention can be seen, comprising a membrane 2 with a longitudinal dimension 1 and suspended by a first longitudinal end 4 on a support 6 and at a second longitudinal end 8 on a support 10.

The supports 6 and 10 form part of a rigid chassis of the device according to the invention.

The membrane 2 according to the present invention comprises a core 12 made from material for transducing mechanical energy into electrical energy, an electrode 14 disposed on its top surface and a second electrode 16 disposed on its bottom surface. The terms "bottom" and "top" are used in relation to FIG. 1 and are under no circumstances limitative, the membrane being able to have a position other than horizontal.

The electrodes 14 and 16 are at least partially disposed vertically in line with each other on each side of the core 12.

The membrane 2 extends along an axis X.

The arrow 18 represents the direction of movement of the objects intended to impact the membrane 2.

According to the present invention, the first and second electrodes 14, 16 extend over the entire length of the membrane 2 and therefore cover the core 12 of transducing material over its entire length.

Thus the probability that objects impacting the membrane 2 come into contact with the electrode 14 is increased compared with the devices of the prior art.

The membrane 2 can be square, rectangular or any suitable shape and held at least by two of its ends along its largest dimension. It is not necessary for this membrane to be tensioned between the two supports 6, 10.

The conductive electrodes 14 and 16 can be produced for example by deposition or cathodic sputtering of a few nanometers thick of a conductive material such as for example copper, nickel or carbon powder. These electrodes then delimit the various electrical generation zones on the surface of the membrane 2.

Advantageously, it is preferable to produce membranes that are elongate in shape and having a small thickness in order to maximise the energy transfer when an object impacts on the structure.

In the particular case of a piezoelectric conversion for a membrane-type geometry, the following formula applies:

$$U_{élec} = \frac{1}{2}\frac{k^2}{Y}\Delta\sigma_{moy}^2 = \frac{1}{2}k^2 Y\Delta\varepsilon_{moy}^2$$

Y being the Young's modulus of the piezoelectric material, $k^2$ being the electromechanical coupling coefficient of the piezoelectric material, $\Delta\sigma_{moy}$ being the mean stress variation in the material, and $\Delta\in_{moy}$ being the mean deformation variation in the material.

It is therefore clear, in order to maximise the electrical voltage at the terminals of the electrodes 14, 16 and therefore the energy transfer, that it is preferable to maximise the mean stress variation and the mean deformation variation in the membrane. This is obtained with a system able to deform over a great amplitude, i.e. with a long thin system, which makes it possible to obtain locally high mean stress variations.

Moreover, in order to maximise the energy recovery over the entire length of the membrane, whatever the axial position of the impact on the membrane, the longitudinal dimension of the electrodes 14 and 16 is designed to be substantially equal to that of the membrane, in particular of the transducing material.

Hereinafter, x will be considered the coordinate of an impact zone along the longitudinal axis X starting from the support 6.

Figure 2:
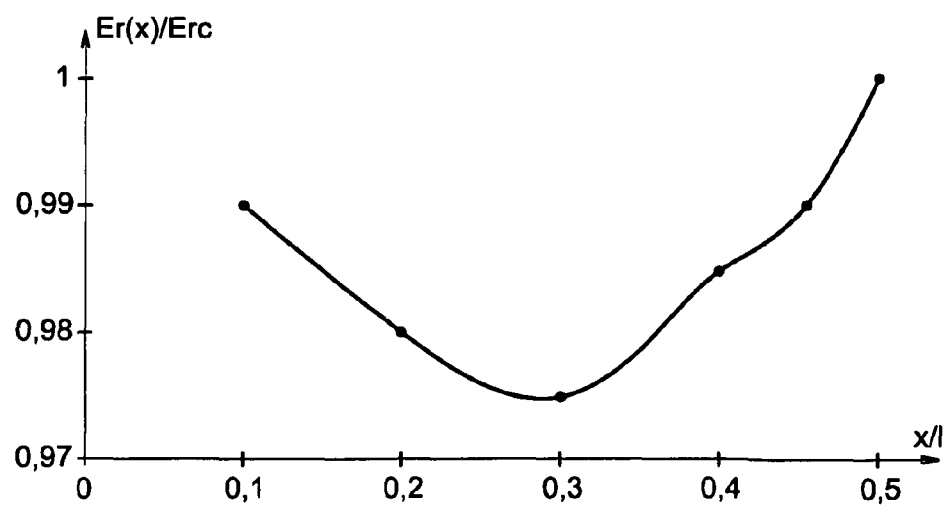
FIG. 2 is a curve representing the change in the energy recovered as a function of the impact zone on the membrane of the energy recovery device of FIG. 1.

In FIG. 2, the variation in the ratio of the recovered energy Er(x) with an impact that took place at a coordinate point x on the recovered energy Erc with an impact that took place at the centre of the membrane as a function of the ratio x over the total length 1 of the membrane can be seen. This curve has been traced for a membrane 10 cm long, 10 cm wide and 25 μm thick, the object impacting the membrane being a drop of water 1 mm in diameter moving at 3 m/second.

It can be seen that the ratio of the energy recovered at x to the energy recovered at the centre of the membrane varies very little as a function of x, this ratio varying between 0.975 and 1. Thus, by virtue of the present invention, a device for converting mechanical energy into electrical energy is obtained, the recovery efficiency of which is very little dependent on the position of the impact over the entire surface of the membrane.

The core 12 of the membrane 2 can be produced from solid piezoelectric material such as LZT (Lead Zirconate Titanate) or polymers such as PVDF (polyvinylidine fluoride), of by means of electroactive polymers such as for example a VHB 4910® acrylic dielectric polymer from the 3M Company.

The choice of the material and the choice of its thickness depend on the mechanical stresses applied to the system: for impacts of drops of water the diameter of which is between 1 and 5 mm, a PVDF membrane having a thickness of around 10 microns may be selected, and this will be able to deform significantly following the impacts of the drops.

For more bulky and heavier objects, for example cereal grains, or rocky particles, it is possible to use a thicker PVDF film (around few hundreds of microns) or a mechanically more rigid element such as LZT or a thick electroactive polymer of the dielectric type (thickness greater than 100 μm-1 mm).

Likewise, the medium in which the device is placed can be a decisive factor in the choice of the transducing material.

In the case of a wet environment, the optimum in terms of energy production and mechanical strength can be obtained with electroactive materials of the IPMC type. Moreover, the choice between piezoelectric or electroactive materials can also be made for example according to the excitation frequency domain. For example, for excitation frequencies greater than 1 kHz, piezoelectric materials are particularly suitable, whereas on the other hand for excitation frequencies below 1 kHz, electroactive materials appear more suitable.

In general terms, the choice is generally determined by an optimum between the energy recovered, for which it is generally sought to obtain high deformations, and therefore to have thin systems, and the mechanical strength, which requires a minimum thickness in order to guarantee strength and service life of the energy recovery device.

In addition, as mentioned previously, it is not necessary for the membrane to be suspended in a tensioned fashion. This is particularly advantageous in the case of random impacts, such as those of drops of rain or any solid grains. It can then be provided that, offload, no mechanical tension is applied to the membrane, and thus the vibrating membrane will at each impact undergo a high variation in deformation, maximising the quantity of mechanical energy that can be converted into electrical energy.

In the case of repetitive impacts at regular frequency, it may on the other hand be advantageous to suspend the membrane under tension. The membrane is then sized and/or a mechanical tension to which it is subject offload is chosen so that the resonant frequency of the membrane coincides with the frequency of the impacts, which will increase the quantity of mechanical energy converted into electrical energy.

The mechanical tension can be adjusted by providing supports 6, 10 mounted on rails so as to be able to separate them from each other.

Figure 3:
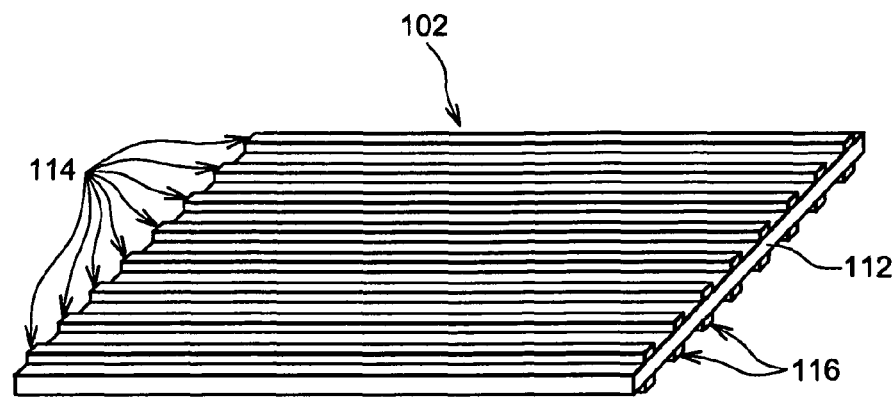
FIG. 3 is a view in perspective of a second embodiment of the membrane of the energy recovery device according to the present invention.

In FIG. 3, a second embodiment of a membrane for an impact energy recovery device according to the present invention can be seen, and this embodiment is particularly advantageous since it optimises the quantity of energy recovered.

The membrane 102 shown in FIG. 3 comprises a core 112 made from material for transducing mechanical energy into electrical energy, on which there are disposed electrodes 114, 116 extending over the entire length of the top and bottom faces of the core 112 respectively.

According to this second embodiment, the membrane comprises several electrodes 114 disposed on the top surface of the core 112 and several electrodes 116 disposed on the bottom surface of the membrane 102.

Each electrode 114 is disposed at least partially vertically in line with an electrode 116.

These electrodes 114, 116 form parallel strips distributed over the entire width of the core 112, the electrodes 116 being disposed vertically in line with the electrodes 114. In the first embodiment, the electrodes 14, 16 form a continuous layer over each of the faces of the core 12 respectively.

This discrete distribution of the electrodes 114, 116 optimises the recovery of energy over the entire surface of the membrane 102, by limiting the movement of the charges and their symmetrical distribution.

This is because, when an object impacts the top surface of the membrane 2, the core 12 is deformed, giving rise to the generation of a voltage in the transducing material because of the asymmetry of the distribution of the charges.

The energy generated is then stored in electrical storage means, of the battery type.

In the case of the electrodes 14, 16 shown in FIG. 1 continuously covering the entire top surface and the entire bottom surface of the core 12, the charges can move in the core 2 by means of the electrodes 12, 14. On the other hand, in the case of a discrete distribution of the electrodes 114, 116 over the top surface of the core and the bottom surface of the core 12, the movement of the charges is limited and the quantity of energy recovered is increased.

The inventors then noted that, even if the quantity of energy potentially recoverable is less than that of the device in FIG.

1 with continuous electrodes 14, 16, the quantity of energy actually recovered with the device in FIG. 3 is greater.

The width of the electrodes is chosen so as to be greater than the order of magnitude of the size of the objects impacting the surface of the membrane 2. For example, in the case of drops of water with a diameter of 1 mm and the impact of which has a diameter of 4 mm, the width of the electrodes is greater than 4 mm.

Figure 5:
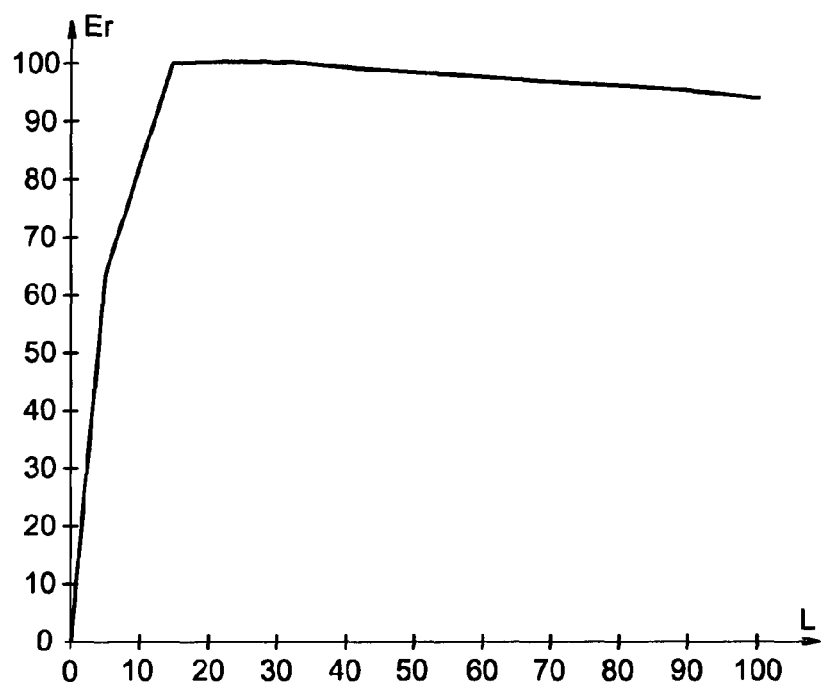
FIG. 5 is a curve representing the change in the energy recovered as a function of the width of a strip forming the membrane in FIG. 4, this ribbon having a length of 10 cm and a thickness of PVDF transducing material of 25 µm.

FIG. 5 shows the change in the electrical energy recovered Er as a function of the width L of the electrodes in millimeters.

The transducing element has a length of 10 cm and a thickness of 25 µm, the core 212 is produced from PVDF and covered on each side with electrodes with a layer of nickel few nanometers thick that do not interfere with the mechanical behaviour of the membrane. The object impacting the surface of this element is a drop of rain with a diameter of 1 mm, the diameter of which at the time of impact can extend up to 4 mm. It can be seen from reading this graph that the electrode width of 10 mm makes it possible to recover the maximum energy transmitted at the time of impact although a wider electrode can give equivalent energies.

However, in this case, firstly the energy dissipated by an electrode covering the entire core will be greater, and therefore will have a lower overall efficiency, and secondly the form in which the energy is recovered in the case of narrow electrodes is more suited to the electronic circuits managing and recovering this energy.

For example, for a core made from piezoelectric material a narrow blade makes it possible to obtain higher recovered voltages for a given energy, which will limit losses during the processing of the signal, in particular during the rectification step for converting the alternating signal into a continuous signal.

Figure 4:
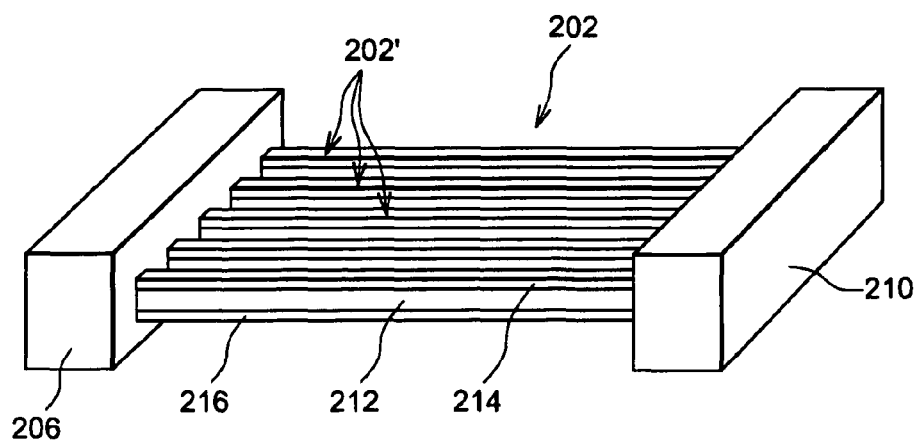
FIG. 4 is a view in perspective of a third embodiment of the membrane of the device according to the present invention.

In FIG. 4, a third embodiment of an impact energy recovery membrane can be seen.

The membrane 202 is, in this embodiment, formed by a plurality of discrete elements 202' disposed parallel to one another and fixed at each of their longitudinal ends to supports 206, 208.

Each discrete element 202' comprises a core 212 made from transducing material covered on each side by electrodes 214, 216 extending over the entire length of the core 212.

The widths of these elements 202' forming strips or blades is substantially of the same order of magnitude as the diameter of the object the impact energy of which it is wished to recover.

According to this embodiment, each of the transducing elements is made mechanically independent. The deformation of each of the elements is increased with respect to the embodiments shown in FIGS. 1 and 3 since the stress involved in the impact of the object on an element 202' is not "dampened" by a mechanical connection with the other elements 202'.

In the case of the devices in FIGS. 1 and 3, when an object impacts the surface of the membrane 2, 102, the stress applied by the object, which is oriented substantially perpendicular to the surface of the membrane 202, causes a deformation both in the direction perpendicular to the membrane but also in a direction parallel to the surface of the membrane. The total deformation is all the smaller, the greater the energy necessary for the deformation in the plane of the membrane. In the case of discrete elements 202', since each discrete element 202' extends very little laterally, the energy necessary for its deformation is very small. Consequently the deformation in a direction perpendicular to the membrane, or more particularly to each of the discrete elements 202', is greater, and consequently the electrical energy recovered by conversion of the mechanical energy is greater.

The device in FIG. 4 also has the advantage of allowing discharge of the objects impacting the membrane. This is because these pass through the spaces separating the discrete elements 202', the width of these spaces being chosen according to the dimension of the objects impacting the membrane 202.

An example of sizing of a device according to FIG. 4 will now be given.

In the case where the device is applied to the recovery of impact energy of drops of a liquid, for example water or other, the device can be sized in the following manner:

The conversion device comprises a set of blades, embedded at each of their ends and distributed uniformly. These blades are formed by a material converting mechanical energy into electrical energy, for example a piezoelectric polymer (type PVDF) or an electroactive polymer. Each blade is covered with a bottom electrode and a top electrode, covering the polymer, these electrodes extending over the entire length of the blades. The top electrodes are advantageously produced continuously, for example in a single piece between the longitudinal ends of the blades anchored so as to provide the electrical connection between all the top electrodes. Likewise, for the bottom electrodes, they are advantageously produced in a single piece. This particular embodiment simplifies the production of the electrical connections since two connections for each set of electrodes suffice.

The width of the blades is determined according to the size of the objects impacting the blades, for example in the case of drops the width of the blade is of the same order of magnitude as the diameter of the drop spread after impact. In the case of a raindrop 1 mm in diameter, the diameter after spreading is 4 mm, and consequently the width of the blade is chosen so as to be at least equal to the diameter after spreading, for example around 4 mm. Moreover, the length of the blades is advantageously chosen so as to be at least an order and magnitude greater than its width.

In addition a spacing will be chosen between the blades so that it is no more than that of the drops of water before impact, and thus, even in the case of drops passing between the blades, these impact the blades and some of their energy is recovered. For example, the spacing between the blades is chosen at around the diameter of the drops before impact.

In the case of the recovery of energy of raindrops of 1 mm, it is therefore possible to produce a device where the blades are made from PVDF 25 µm thick, 4 mm wide and 10 cm long, these blades being spaced apart by 1 mm.

Naturally a membrane carrying apertures extending over all or part of the length of the membrane between the electrodes does not depart from the scope of the present invention.

It can also be envisaged inclining the surface of the membrane in order to facilitate the gravity discharge of the objects impacting the surface of the membrane.

Figure 6:
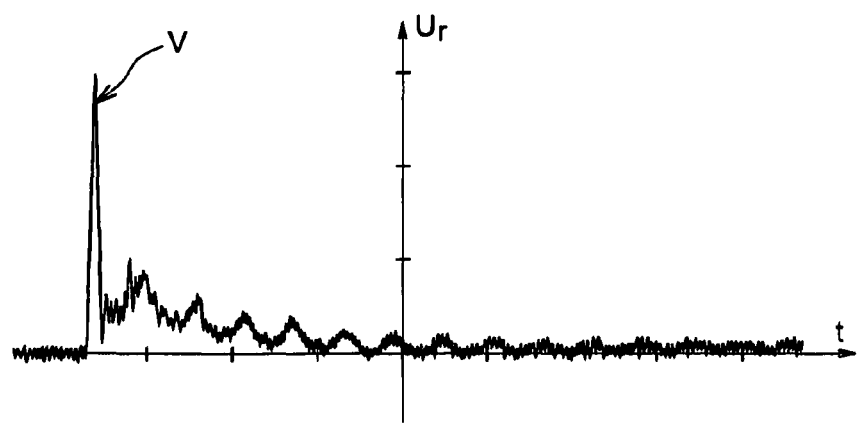
FIG. 6 is a representation of a recording of the voltage recovered at the terminals of the electrodes covering a ribbon of PVDF 25 µm thick and 3 mm wide over a length of 10 cm at the time of the impact of a raindrop with a diameter of 1 mm having a speed of 3 mm/second.

In FIG. 6, an example can be seen of voltage Ur recovered as a function of time t at the terminals of a membrane 10 cm long, 3 mm wide and 25 µm thick, the core of which is made from PVDF, the object impacting being a raindrop with a diameter of 1 mm and having a speed of 3 mm/second before impact. The scale for this recording is 40 milliseconds per division on the x axis and 1 volt per division on the y axis. It is then found that the recovered voltage Ur reaches a value V of several volts.

Figure 7:
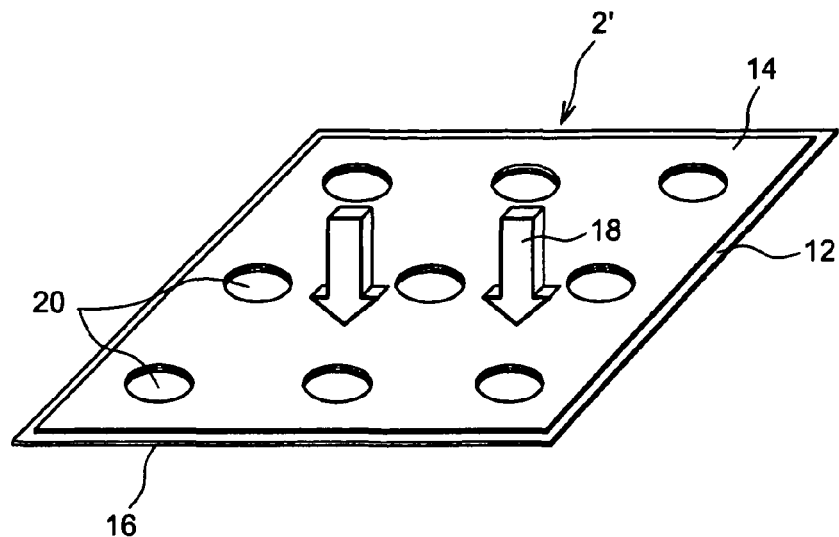
FIG. 7 is a schematic representation of a variant of the first embodiment of a membrane of an energy recovery device according to the present invention.

In FIG. 7, a variant embodiment of the membrane 2' of the device of FIG. 1 can be seen. The membrane 2' comprises orifices 20 for allowing the discharge of objects impacting the surface of the membrane 2', the top electrode 14 and bottom electrode (not visible) extending continuously over the core 12, and over the entire length of the membrane 2'.

The orifices 20 are shown circular, but they may have any other shape, for example in the shape of a slot.

These energy recovery devices, in the case of the recovery of the energy of impacts of drops of rain, are therefore intended to be used in an outdoor environment. They are therefore particularly suitable for being associated with another energy recovery device, in particular a solar energy recovery device.

Figure 8:
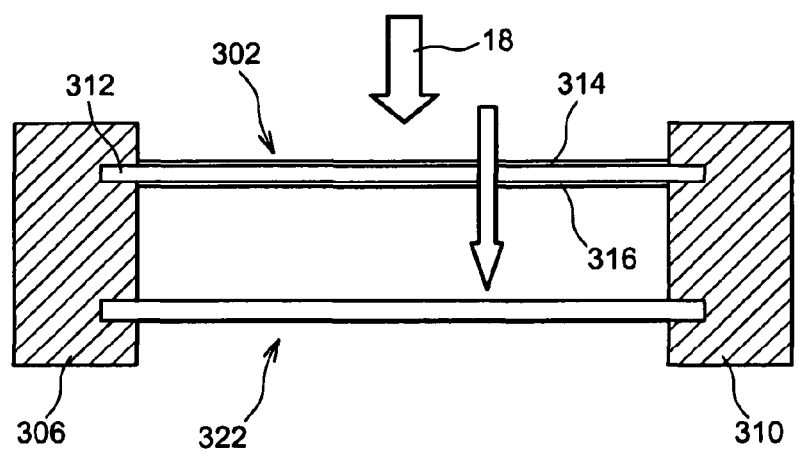
FIG. 8 is a schematic representation in longitudinal section of a hybrid energy recovery system according to the present invention including the device shown in FIG. 1 and photovoltaic cells.

In FIG. 8, a hybrid energy recovery system can be seen, making it possible both to recover solar energy by means of photovoltaic cells and to recover the impact energy of raindrops.

For this purpose, the hybrid device comprises a membrane 302 according to the present invention transparent to light suspended between two supports 306, 310, the transducing material being chosen for example from piezoelectric materials or acrylic dielectric polymers, and photovoltaic cells 322 disposed below the transducing membrane in the direction of movement of the raindrops, substantially parallel to the membrane 302.

The membrane has a core 312 and electrodes 314, 316 on each side of the core and extending over the entire length 1 of the membrane.

Thus, in sunny weather, the light passes through the membrane 302 and excites the photovoltaic cells. In rainy weather, the raindrops or hailstones impact the membrane.

This device is therefore particularly suitable for functioning in a natural environment under various meteorological conditions: in rainy conditions and in sunny conditions. The quantity of energy recovered is therefore increased.

The energy recovery devices according to the present invention are of course associated with means of storing this electrical energy (not shown), these being known to persons skilled in the art they will not be detailed further in the present application.

All the energy conversion devices according to the present invention can be associated with or integrated in a sensor at least partly supplied with the electrical energy recovered by conversion of the impact energy.

This sensor can, also advantageously, use the membrane as described as a measuring system. In the case of impacts, it may be a case of an impact counter, measuring the frequency of the impacts, measuring the size or mass of the particles impacting the membrane. This system can then make it possible, for example in the case of an energy conversion device disposed in a natural environment, to obtain information on the quantity of rain fallen or on the frequency of showers in this environment.

The device according to the present invention can combine both an energy recovery function and a sensing function.

The device can in fact make it possible to collect information from characteristics of the impact, this information relating to the characteristics of the device per se.

For example, the impact of a drop excites a resonant frequency of the blade or of the membrane, a resonant frequency that is detected on the graph in FIG. 6 by the presence of the voltage peak designated by V. This resonant frequency is related to the mechanical and geometric characteristics of the membrane, in particular its thickness, its length, the type of material making it up, etc. It is therefore possible, by measuring a variation in this resonant frequency over time, to detect for example a variation in the thickness of the blades. It is thus possible to detect an increase in the thickness of the membrane or blades by an increase in its thickness and thus to deduce therefrom the presence of a deposit of material on the membrane, of the limestone or organic deposit type, and to determine the thickness of this deposit. This information can then be used to provide for maintenance of the device, for example cleaning or replacement of the membrane.

In addition, particularly advantageously, this change in characteristic can be measured in a completely autonomous manner, the energy necessary for this measurement being directly contributed by the impact of the drops.

As described previously, the impact energy conversion devices according to the present invention can use "solid" objects, such as grains of cereals or gravel, and the recovery device is then used in filling or loading devices.

In the embodiments described, the membrane receives the impact on only one of its faces, but a conversion device in which the membrane is impacted on both faces does not depart from the scope of the present invention.

Mechanical vibration energy recovery systems of the membrane type have therefore indeed been produced, acted on by the impact of objects, wherein the geometry of the system is optimised to make the energy recovery effective over the entire surface offered to the mechanical stresses, independently of the location of the mechanically stressed zone or zones.

The invention claimed is:

1. Device for converting mechanical energy from the random impact of discrete objects into electrical energy, comprising:
   a frame;
   juxtaposed strips suspended on the frame by at least a first and second longitudinal end, the strips configured to be impacted by discrete objects in a direction substantially transverse to a mid-plane of the strips, the strips having a length much greater than their width, the juxtaposed strips configured to be mechanically independent from each other to vibrate freely;
   a first plurality of electrodes on a first face of a core of the strips, the core being made from material for transducing mechanical energy into electrical energy, the first plurality of electrodes comprising a first set of juxtaposed discrete blades extending longitudinally from the first longitudinal end of the strips to the second longitudinal end of the strips; and
   a second plurality of electrodes on the second face of the core of strips, the second plurality of electrodes comprising a second set of juxtaposed discrete blades extending from the first longitudinal end of the strips to the second longitudinal end of the strips,
   the first and second pluralities of electrodes overlapping at least partially, and
   apertures extending between the first and second set of electrode blades, the apertures having a width of at least 1 millimeter and facilitate the discharge of the objects that impact the strips.

2. Device according to claim 1, the width of the electrodes in the form of blades being greater than the size of the objects intended to impact the strips.

3. Device according to claim 2, wherein the device strips recover the impact energy of objects having a first diameter before impact on the strips and a second diameter after impact on the strips, the width of the electrode blades is at least equal to the second diameter after impact.

4. Device according to claim 1, the width of the blades being substantially equal to that of the strips.

5. Device according to claim 1, the strips being not subjected to any mechanical tension in the absence of impact.

6. Device according to claim 1, the membrane being subjected to a given mechanical tension in the absence of impact so that the resonant frequency of the strips coincide with the frequency of impacts.

7. Device according to claim 1, the core being made from piezoelectric material or an electroactive material.

8. Device according to claim 1, wherein the strips are configured to be impacted by drops of water.

9. Device according to claim 1, also comprising a device for converting solar energy into electrical energy, comprising photovoltaic cells, the strips being produced from material transparent to light, the photovoltaic cells being disposed downstream of the strips with respect to the direction of movement of the objects.

10. Device according to claim 8, wherein the device strips are configured to recover the impact energy of objects having a first diameter before impact on the strips and a second diameter after impact on the strips, the width of the electrode blades is at least equal to the second diameter after impact and including apertures having a width of no more than the first diameter before impact.

11. Device according to claim 1, wherein a tension of the strips is adjustable by means for modifying the spacing between the first longitudinal end and the second longitudinal end of the membrane.

12. Device according to claim 11, wherein the means for modifying the spacing between the first longitudinal end and the second longitudinal end of the membrane comprise rails on which supports of the strips are mounted.

13. System comprising a device for converting mechanical energy from the impact of objects into electrical energy, comprising:

a frame;

a membrane suspended on the frame by at least a first and second longitudinal end, the membrane being intended to be impacted by the objects in a direction substantially transverse to a mid-plane of the membrane;

a first plurality of electrodes on a first face of a core of the membrane, said core being made from material for transducing mechanical energy into electrical energy, the first plurality of electrodes comprising a first set of juxtaposed discrete blades extending from the first longitudinal end of the membrane to the second longitudinal end of the membrane; and a second plurality of electrodes on a second face of the core the second plurality of electrodes comprising a second set of juxtaposed discrete blades extending from the first longitudinal end of the membrane to the second longitudinal end of the membrane, the first and second pluralities of electrodes overlapping at least partially, and the core comprising apertures extending between the electrode blades, the system also comprises a sensor for a physical quantity, the sensor being at least partially powered from the electrical energy provided by the conversion device.

14. System according to claim 13, wherein the membrane includes a sensitive zone which functions as the sensor to obtain information on the objects impacting said membrane.

15. System according to claim 13, wherein the membrane includes a sensitive zone which functions as the sensor to detect a variation in a characteristic of the membrane by detecting a variation in resonant frequency of the membrane.

* * * * *

UNITED STATES PATENT AND TRADEMARK OFFICE
CERTIFICATE OF CORRECTION

PATENT NO. : 8,456,063 B2  Page 1 of 1
APPLICATION NO. : 12/526246
DATED : June 4, 2013
INVENTOR(S) : Jager et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 315 days.

Signed and Sealed this
Eighth Day of September, 2015

Michelle K. Lee
*Director of the United States Patent and Trademark Office*